United States Patent [19]
Wanat et al.

[11] Patent Number: 6,103,443
[45] Date of Patent: Aug. 15, 2000

[54] PHOTORESIST COMPOSITION CONTAINING A NOVEL POLYMER

[75] Inventors: Stanley F. Wanat, Scotch Plains; Kathryn H. Jensen, Edison; Ping-Hung Lu, Bridgewater, all of N.J.; Douglas McKenzie, Easton, Pa.

[73] Assignee: Clariant Finance Lmited, Virgin Islands (Br.)

[21] Appl. No.: 08/976,284

[22] Filed: Nov. 21, 1997

[51] Int. Cl.[7] .............................. G03F 7/023; G03F 7/30
[52] U.S. Cl. .................... 430/191; 430/192; 430/193; 430/326; 430/330
[58] Field of Search ................... 430/165, 191, 430/192, 193, 270.1, 326, 330

[56] References Cited

U.S. PATENT DOCUMENTS

| | | | |
|---|---|---|---|
| 3,869,292 | 3/1975 | Peters | 96/115 R |
| 4,439,516 | 3/1984 | Cernigliaro et al. | 430/323 |
| 4,642,282 | 2/1987 | Stahlhofen | 430/165 |
| 4,717,640 | 1/1988 | Stahlhofen | 430/192 |

OTHER PUBLICATIONS

Light Sensitive Systems, Chapter 7.4, 1965, J. Kosar.

Chemistry & Application of PhenolicResins, Chapter 4, 1979, A. Knop, W. Scheib.

*Primary Examiner*—John S. Chu
*Attorney, Agent, or Firm*—Sangya Jain

[57] ABSTRACT

A photoresist composition comprising a film forming resin obtained by condensing a phenol derivative and a substituted diphenyl ether, a photoactive compound, and a solvent. The photoresist composition may also contain an alkali-soluble, film-forming resin, such as a novolak resin. The photoresist of the instant invention improves the photospeed, resolution and thermal stability of the photoresist images.

12 Claims, No Drawings

PHOTORESIST COMPOSITION CONTAINING A NOVEL POLYMER

BACKGROUND OF THE INVENTION

Photoresist compositions are used in microlithographic processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development step, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions. Positive working photoresist compositions are currently favored over negative working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of less than one micron, are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Miniaturization of the semiconductor devices has lead to changes in the basic photoresist chemistries, in that resolution, photosensitivity, thermal stability have now become important factors that determine the choice of photoresist to be used in the processing of semiconductor devices. Higher resolution photoresists allow smaller dimensions to be delineated in the photoresist. Photoresists with higher photosensitivity allow higher throughput of the substrates through the exposure step and photoresists with higher air, thermal stability allow for the use of higher processing temperatures for the photoresist without deforming the shape of the imaged photoresist.

Metal contamination has also been a problem for a long time in the fabrication of high density integrated circuits and computer chips, often leading to increased defects, yield losses, degradation and decreased performance. In plasma processes, metals such as sodium and iron, when they are present in photoresists, can cause contamination especially when silicon wafers are coated with a liquid positive photoresist and subsequently stripped off, such as with oxygen microwave plasma. The performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels as low as 1.0 ppm in the photoresist have been found to adversely affect the properties of such semiconductor devices.

The present invention relates to a novel polymer which when present in a photosensitive composition improves the performance of the photoresist as it relates to providing higher photosensitivity, cleaner images and, especially, higher thermal stability.

SUMMARY

The current invention relates to a photoresist composition comprising a photoactive compound, a solvent composition, and a novel polymer which is an acid catalysed reaction product of a substituted diphenyl ether of structure (1),

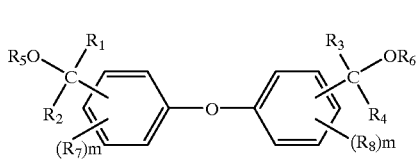

with a phenol of structure (2)

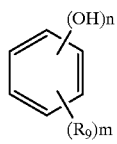

where, $R_1$ to $R_9$ are independently H, OH, halogen, ($C_1$ to $C_4$) alkyl, ($C_1$ to $C_4$)alkoxy, aryl or aralkyl, m=1–5 and n=1–4.

In one embodiment of the invention an alkali-soluble resin may be added to the composition. The invention further relates to a process of imaging the photosensitive composition. The invention also relates to a method of making the novel polymer and a photoactive compound derived from the polymer.

DETAILED DESCRIPTION OF THE INVENTION

The present invention discloses a novel polymer, a process of making it and a photosensitive composition comprising the novel polymer, wherein the polymer is an acid catalysed reaction product of a substituted diphenyl ether of structure (1),

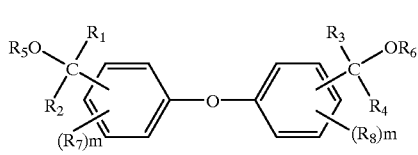

with a phenol of structure (2)

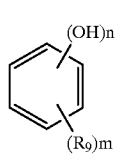

where, $R_1$ to $R_9$ are independently H, OH, halogen, (Cl to $C_4$) alkyl, ($C_1$ to $C_4$)alkoxy, aryl or aralkyl, m=1–5 and n=1–4.

The photosensitive composition of the current invention comprises a polymer, a photoactive compound and a solvent, where the novel polymer is used alone or as a mixture with another alkali soluble, film-forming resin.

The novel polymer of the invention is obtained from an acid catalysed condensation polymerization reaction of the substituted diphenyl ether of structure (1) and the phenol of structure (2). The substituted diphenyl ether, preferably bis methylolated or bis methoxy metholylated diphenyl ether, becomes a highly reactive electrophilic agent with two active sites in the presence of acidic catalysts, thereby providing the co-condensate capable of polymerizing with the phenolic materials. The phenol is a phenolic compound that may contain one to four hydroxyl groups, preferably one to three hydroxyl groups, on the primary benzene ring, and additionally may also contain substituents such as halide, alkyl($C_1$–$C_4$) or alkoxy($C_{1-C4}$) groups, aryl or aralkyl groups. The preferred phenol is pyrogallol, resorcinol or catechol. The most preferred phenol is pyrogallol. The multihydroxy phenol may also be a compound that contains two phenolated groups connected with a linking group, where the linking group may be oxygen, sulfone, carbonyl or alkyl. Examples of such compounds, but not limited to, are bisphenol A, dihydroxybenzophenone, dihydroxysulfone, bisphenolether, etc.

The polymerization uses an acid catalyst such as hydrochloric acid or p-toluene sulfonic acid, for example. Other acid catalysts familiar to one skilled in the art can also be used. The reaction can be run in the absence of a solvent or in the presence of a single solvent or a combination of solvents. Solvents should be non reactive under the reaction conditions. Solvents such as propylene glycol methyl ether, 2-heptanone, 3-ethoxy-3-methyl butanol, butyl acetate, xylene, diglyme, ethylene glycol monoethyl ether may be used. The reaction is preferably run at temperatures between 60–200° C. and for a length of time sufficient to complete the reaction, preferably 3–12 hours. The polymerization reaction is quenched by base neutralization to prevent additional reactivity or chain scission during subsequent distillation. Solvent(s) are removed by vacuum distillation at which point the solid polymer can be isolated by cooling or the polymer can be isolated as a concentrate in a solvent of choice for use in resist formulation. Additional refinements such as fractionation whereby specific molecular weight portions are removed may also be used. Although fractionation is a preferred method, distillation or extraction may be used as well.

The polymer may additionally be treated to remove metal ion contaminants present so that the final resist formulation is low in contaminants. Methods that involve aqueous acid extraction or ion exchange may be used.

The novel polymer can be formulated into a photosensitive composition comprising the novel polymer, a photoactive compound and a solvent composition. In another embodiment of the invention another alkali-soluble resin may be added to the composition. The alkali soluble, water insoluble resins of the photoresist composition may comprise resins such as polyhydroxystyrene, substituted polyhydroxystyrene, novolak resins made from cresols and aldehydes, fractionated novolak resins, and other similar resins known in the art. A particularly preferred composition comprises the novel polymer of the present invention, fractionated novolak resin, photosensitive compound and a suitable solvent. It has been found that the presence of this novel polymer at ranges between about 5–50 weight percent of the total resin composition gives advantageous lithographic properties. When the novel resin is used in a mixture with another resin it is preferred that weight average molecular weight is in the range of 500 to 4000 Daltons.

The production of film forming, novolak resins or polyhydroxystyrenes, which may be used as the alkali-soluble resin, are well known in the art. A procedure for the manufacture of novolak resins is described in Chemistry and Application of Phenolic Resins, Knop A. and Scheib, W.; Springer Verlag, N.Y., 1979 in Chapter 4 which is incorporated herein by reference.

Polyhydroxystyrenes are described in U.S. Pat. No. 3,869, 292 and U.S. Pat. No. 4,439,516, which are incorporated herein by reference. Similarly, the use of o-diazonaphthoquinones as photoactive compounds is well known to the skilled artisan, as demonstrated by Light Sensitive Systems, Kosar, J.; John Wiley & Sons, N.Y., 1965 in Chapter 7.4, which is also incorporated herein by reference. These sensitizers which comprise a component of the present invention are preferably substituted diazonaphthoquinone sensitizers, which are conventionally used in the art in positive photoresist formulations. Useful photosensitizers include, but are not limited to, the sulfonic acid esters made by condensing phenolic compounds such as hydroxy benzophenones, oligomeric phenols and multisubstituted-multihydroxyphenyl alkanes with naphthoquinone-(1,2)-diazide-5-sulfonyl chloride, naphtho-quinone-(1,2)-diazide4-sulfonyl chlorides or naphthoquinone-(1,2)-diazide6-sulfonyl chloride, or mixtures thereof.

Suitable solvents for such photosensitive compositions may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, 2-heptanone, 3-methoxy-3-methyl butanol, butyl acetate, anisole, xylene, diglyme, ethylene glycol monoethyl ether acetate. The preferred solvents are propylene glycol methyl ether acetate (PGMEA), ethyl lactate, 2-heptanone, anisole, ethyl-3-ethoxypropionate (EEP) and 3-methoxy-3-methyl butanol.

In the preferred embodiment, the amount of total resin in the photoresist composition ranges from 60% to about 95% and more preferably from about 70% to about 90% and most preferably from about 75% to about 85%, based on the weight of the total solid components of the resist.

In the preferred embodiment, the photoactive compound is present in the photoresist in an amount of from about I % to about 35%, more preferably from about 5% to about 30% and most preferably from about 10% to about 20%, based on the weight of the solids components.

Other optional ingredients such as colorants, dyes, anti-striation agents, leveling agents, plasticizers, adhesion promoters, speed enhancers, solvents and such surfactants as nonionic surfactants may be added to the photoresist solution of the present invention before the solution is coated onto a substrate. Examples of dye additives that may be used together with the photoresist compositions of the present invention include Methyl Violet 2B (CI. No. 42535), Crystal Violet (CI. 42555), Malachite Green (CI. No. 42000), Victoria Blue B (CI. No. 44045) and Neutral Red (CI. No. 50040) at one to ten percent weight levels, based on the combined weight of resin and photosensitizer. The dye additives help provide increased resolution by inhibiting back scattering of light off the substrate.

Anti-striation agents may be used at up to a five percent weight level, based on the combined weight of resin and photosensitizer. Plasticizers which may be used include, for example, phosphoric acid tri-(beta-chloroethyl)-ester; stearic acid; dicamphor; polypropylene; acetal resins; phenoxy resins; and alkyl resins at one to ten percent weight levels, based on the combined weight of resin and photosensitizer. The plasticizer additives improve the coating properties of the material and enable the application of a film that is smooth and of uniform thickness to the substrate. Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl tri-ethoxysilane up to a 4 percent weight level, based on the combined weight of novolak resin and photosensitizer.

The coating solvents may be present in the overall composition in an amount of up to 95% by weight of the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to 10% weight levels, based on the combined weight of the solids.

The novel polymer may be further reacted with naphthoquinone-(1,2)-diazide-5-sulfonyl chloride, naphtho-quinone-(1,2)-diazide4-sulfonyl chloride, naphthoquinone-(1,2)-diazide6-sulfonyl chloride, or mixtures thereof, to give a novel photoactive compound, which may be formulated into a photoresist comprising the novel photoactive compound and a solvent. Optionally, an alkali soluble resin and/or another photoactive compound may be added to the photoresist.

The prepared photoresist solution, can be applied to a substrate by any conventional method used in the photoresist art, including dipping, spraying, whirling and spin coating. When spin coating, for example, the photoresist solution can be adjusted with respect to the percentage of solids content in order to provide coating of the desired thickness given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters. The substrate may have an adhesion promoted layer of a suitable composition such as one containing hexa-alkyl disilazane.

The photoresist composition solution is then coated onto the substrate, and the substrate is temperature treated at from about 80° C. to about 11 0° C. for from about 30 seconds to about 180 seconds on a hot plate or for from about 15 to about 40 minutes in a convection oven. This temperature treatment is selected in order to reduce the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of a micron in thickness, remains on the substrate. In a preferred embodiment the temperature is conducted at from about 85° C. to about 95° C. The treatment is conducted until the rate of change of solvent removal becomes relatively insignificant. The temperature and time selection depends on the photoresist properties desired by the user as well as equipment used and commercially desired coating times. The coating substrate can then be exposed to actinic radiation, especially ultraviolet radiation, at a wavelength of from about 300 nm to about 450 nm (preferably at about 365 nm), x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 1 50° C., more preferably from about 110° C. to about 1 50° C. The heating may be conducted for from about 10 seconds to about 30 minutes, more preferably from about 45 seconds to about 90 seconds on a hot plate or about 10 to about 30 minutes by convection oven.

The exposed photoresist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. A suitable developer is AZ® Developer available commercially from the AZ Electronic Materials, Clariant Corporation, Somerville, N.J. After removal of the coated wafers from the developing solution, one may conduct an optional post-development heat treatment or bake in increase the coating's adhesion and chemical photoresistance to etching solutions and other substances. The post-development heat treatment can comprise the oven baking of the coating and substrate below the coating's softening point. The industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate. The substrate may also be plasma etched or have metal deposited.

The following specific examples will provide detailed illustrations of the methods of producing and utilizing the compositions of the present invention. These examples are not intended to limit or restrict the scope of the invention in any way and should not be construed as providing conditions, parameters or values which must be utilized exclusively in order to practice the present invention.

EXAMPLE 1

In a 1 liter round bottom flask fitted with stirrer and a thermometer with a constant temperature thermowatch unit, 63 g. (0.5 mole) of pyrogallol, 90.6 g. (0.35 mole) of bis-methoxy methyl diphenylether (MMDPE) and 0.6 g. (0.003 mole) of p-toluenesulfonic acid (PTSA) were dissolved in 100 g. of propylene glycol methyl ether (PGME) at room temperature.

With the thermowatch unit set to 100° C., the mixture was heated to reflux using a rheostat controlled heating mantle. The temperature rose to 110° C. at which point the thermowatch was adjusted to the same temperature. The reflux temperature dropped from 110° to 95° C. over the next 1 ½ hours and remained at that temperature for the course of the reaction. The solution was heated at reflux for a total of 6 hours at which point 1.3 g. (0.008 mole) of triethanolamine was added to neutralize the acid catalyst.

The volatile materials were distilled off in stages with the thermowatch set successively at 190, 210 and finally 220° C. until no additional distillate was obtained. While the resin was still molten, ethyl lactate was added to the stirred mixture until a solution was obtained. The solution was adjusted to about 40% solids by weight. The weight average molecular weight (Mw) as measured by Gel Permeation Chromatography (GPC) was about 4400 Daltons.

EXAMPLE 2

A batch of resin was made using the same procedure as shown in example 1 except methanol (b.p. 64—64° C.) was used as the solvent replacing PGME (b.p. 119° C.). A polymer with Mw of 1479 Daltons was obtained.

EXAMPLE 3

In a 500 ml. round bottomed flask fitted with a condenser, overhead stirrer and thermometer with thermowatch, 63.0 g. of pyrogallol (0.5 mole), 77.4 g. of MMDPE (0.3 mole) and 0.6 g. of p-toluene sulfonic acid (0.003 mole) were dissolved in 100 9. of PGME. The thermowatch was set at 110° C. and the solution was heated to reflux over the course of the six hour reaction period. After 6 hours, 1.3 9. of triethanolamine was added to neutralize the acid catalyst. The solvent was distilled in stages up to 220° C. until no additional distillate was obtained. The molten resin was poured into a crystallization dish and allowed to solidify. The Mw for this resin was 3647 Daltons.

EXAMPLE 4

Two resists, comparative and test samples, were made using the ingredients and ratios shown below. The comparative sample did not contain any of the novel polymer while the test sample contained the same total resin concentration as the comparative sample but substituted 2.46% of the total resin with the novel polymer from example 1. The photoactive compound for both was a mixture of 71% NK 280 with 70% esterification level and 29% NK 240 with 60% esterification level (proprietary 2,1,5 diazonaphthoquinone compound available from Nippon Zeon Co.) (PAC). The alkali-soluble resin for both samples was a fractionated resin made by condensing m-cresol, p-cresol and 2,3,5 trihydroxy benzene in a ratio of 5:4:2 with formaldehyde or paraformaldehyde with the mole ratio of total phenolics to formaldehyde of 1 to 0.68 using 0.03% of oxalic acid as a catalyst (Base Resin).

Samples were prepared as follows:

| Ingredient | Comparative Sample | Test Sample |
| --- | --- | --- |
| PAC | 2.86 grams | 2.86 grams |
| Base Resin | 8.14 grams | 6.91 grams |
| Novel Polymer from Example 1 | 0.00 grams | 1.23 grams |
| Ethyl Lactate | 33.15 grams | 33.15 grams |
| n-butyl acetate | 5.85 grams | 5.85 grams |

Silicon wafers were coated at 0.97 micron coating thickness with the samples. A soft bake at 90° C. for 90 seconds, exposure on a Nikon i-line exposure device using a 0.54 NA followed by a post exposure bake (PEB) of 110° C. for 60 seconds was followed by development in a AZ® MIF 300 developer (tetramethyl ammonium hydroxide) (available from AZ Electronic Materials, Clariant Corporation, Somerville, New Jersey) for 70 seconds at 23° C. Scanning electron micrographs (SEM) of the two samples were compared for photospeed, standing waves, side wall profiles and general reproduction of critical dimensions. The test sample had over 26% faster photospeed than the control sample to replicate nominal optimum profiles. In addition the test sample exhibited sharper side wall profiles, less standing waves and better resolution at the finest resolution lines.

EXAMPLE 5

Resist formulations were prepared as follows: The test sample was made using the novel polymer of example 1, while the control sample was prepared by replacing the novel polymer with BI-126X (a proprietary monomeric phenolic photospeed enhancing compound available from Nippon Zeon Co.).

| Ingredient | Control Sample | Test Sample |
|---|---|---|
| PAC | 2.86 grams | 2.86 grams |
| Base Resin | 6.91 grams | 6.91 grams |
| BI-126X | 1.23 grams | 0.00 grams |
| Novel Polymer from Example 1 | 0.00 grams | 1.23 grams |
| Ethyl Lactate | 33.15 grams | 33.15 grams |
| n-Butyl Acetate | 5.85 grams | 5.85 grams |

Silicon wafers were coated, exposed and developed using the conditions described in Example 4. Large feature size images were used and the exposures were adjusted for optimum resolution with each sample. Individually coated wafers were heated on a hot plate with temperatures in the range from 110–1 30° C. in 5° C. increments. The samples were checked by secondary electron microscope and the maximum temperature possible for retention of intact features was recorded. The test sample maintained side wall profiles at 120–125° while the control sample could only maintain the same level of profile at 115–120° C. Thus, the test sample with made with the novel polymer of the present invention gave a better thermal stability as compared to the control sample.

EXAMPLE 6

In a 1 l. round bottomed flask, 108 g. (1 mole) of a 65135% mixture of m/p-cresols were dissolved in 200 g. of n-butyl acetate. In this solution, 0.85 g. (0.005 mole) of p-toluenesulfonic acid and 180.6 9. (0.7 mole) of bis-methoxy methyl diphenyl ether (MMDPE) were dissolved and the solution was heated to reflux for 6 hours. The solution turned dark orange red and became more viscous. The solution was distilled atmospherically to 200° C. and then under vacuum at 30 mm Hg to 220° C. until no condensate came off. The molten material was poured into a crysallization dish and allowed to cool. The brown solid gave a weight average molecular weight of around 15,000 by Gel Permeation Chromatography. A photoresist was formulated by mixing the 5.7 g. of the polymer with 2.4 g. of 2,1,5 diazonaphthoquinone ester of trishydroxyphenyl ethane, 2.45 g. BI-126X in 78.1 g. ethyl lactate (EL). The photoresist was coated and imaged as in example 4 and an image was obtained.

EXAMPLE 7

108 g. (1 mole) of 65/35% mixed m/p-cresols were dissolved in 200 g. of n-butyl acetate along with 0.85 g. (0.005 mole.) of p-toluenesulfonic acid. The solution was heated to 95° C. and a mixture of 52.7 g. (0.65 mole) of formaldehyde (as 37% formalin solution) and 15.5 g. (0.06 mole) of MMDPE were slowly added. The reaction mixture was heated at reflux for 6 hours and then distilled at atmospheric pressure to 200° C. and finally at 30 mm Hg vacuum to about 200° C. The molten resin was allowed to cool in a crystallization dish. The brown solid resin gave a weight average molecular weight of around 12,000 by Gel Permeation Chromatography. When formulated into a resist and imaged according to the same method as shown in example 6, an image was obtained.

EXAMPLE 8

A low molecular weight analog of example 6 was prepared by reacting 1 mole of 65/35% mixed m/p-cresols with 0.65 mole of MMDPE using the same reaction and isolation conditions shown in example 2. The isolated resin had a Mw of around 1400.

In a 1 l. cold water jacketed flask fitted with a circulating cooling bath of waterlethylene glycol, 30.2 g. (0.1 mole) of the resin prepared was mixed with 18.8 g. (0.07 mole) of 2,1,5 diazonaphthoquinone sulfonyl chloride in 490 g. of gamma-butyrolactone. To the cooled solution, 8.09 g. (0.08 mole) of N-S morpholine was slowly added while keeping the temperature below 1 5° C. After the addition was complete, the solution was heated to 30° C. for 6 hours. One gram of acetic acid was added to quench the remaining base. The suspended salts were filtered out and the filtrate was precipitated by adding slowly to 10 liters of cold distilled water. The solids were dried under vacuum at 50° C.

The product is a photoactive compound and can be used to make a typical positive photoresist formulation. The photoactive is used alone in a solvent or added as a photoactive compound to a mixture of a novolak resin and/or the novel polymer of this invention in ethyl lactate.

What is claimed is:

1. A photoresist composition comprising:

a) a novel polymer which is an acid catalysed reaction product of a substituted diphenyl ether of structure (1)

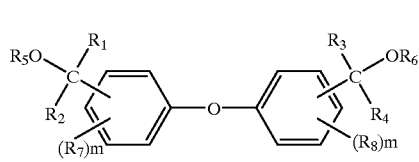

(1)

with a phenol
selected from catechol, resorcinol and pyrogallol,
where, $R_1$ to $R_8$ are independently H, OH, halogen, ($C_1$ to $C_4$) alkyl, ($C_1$ to $C_4$)alkoxy, aryl or aralkyl, m=1–5 and n=1–4, and further where the novel polymer has molecular weight ranging from about 1000 to about 5500;

b) a photoactive compound;

c) a novolak resin; and, d) a photoresist solvent composition.

2. The photoresist composition according to claim 1, wherein the novolak resin is a single or a mixture of novolak resins.

3. The photoresist composition according to claim 2, wherein the alkali-soluble, film forming resin is present at about 50–95% of the total resin composition.

4. The photoresist composition according to claim 1, wherein the substituted diphenyl ether is bis-methoxy methyl diphenylether.

5. The photoresist composition according to claim 1, wherein the photoactive compound is selected from 2,1,4-diazonaphthoquinone sulfonate, 2,1,5- diazonaphthoquinone sulfonate, 2,1,6- diazonaphthoquinone sulfonate or mixtures thereof.

6. The photoresist composition according to claim 1, wherein the photoresist solvent composition is selected from a group consisting of propylene glycol mono-alkyl ether, propylene glycol methyl ether acetate, 2-heptanone, butyl acetate, anisole, amyl acetate, ethyl-3-ethoxypropionate, ethyl lactate, ethylene glycol monoethyl ether acetate, and mixtures thereof.

7. The photoresist composition of claim 1, further comprising one or more additives selected from a group consisting of colorants, leveling agents, anti-striation agents, plasticizers, adhesion promoters, speed enhancers and surfactants.

8. A process for imaging photoresist comprising the steps of:
 a) coating a substrate with a positive photoresist composition from claim 1;
 b) heat treating the coated substrate until substantially all of said solvent composition is removed;
 c) imagewise exposing the coated photoresist composition to actinic radiation;
 d) removing the imagewise exposed areas of said coated photoresist composition with a developer; and
 e) optionally, heating the substrate either before or after the removing step.

9. The process of claim 8, further comprising heating said coated substrate from a temperature of from about 90° C. to about 150° C. for from about 30 seconds to about 180 seconds on a hot plate or from about 15 minutes to about 40 minutes in an oven after the exposure step but before the developing step.

10. The process of claim 8, further comprising heating said coated substrate at a temperature of from about 90° C. to about 150° C. for about 30 second to about 180 seconds on a hot plate or for from about 15 minutes to about 40 minutes in an oven after the developing step.

11. The process of claim 8, wherein the exposure step is conducted with radiation having a wavelength from about 180 nm to about 450 nm.

12. The process of claim 8, wherein the developer is an aqueous solution of tetramethylammonium hydroxide.

* * * * *